(12) United States Patent
Shoda et al.

(10) Patent No.: US 7,977,866 B2
(45) Date of Patent: Jul. 12, 2011

(54) ORGANIC ELECTROLUMINESCENCE ELEMENT HAVING PARTITION WALL COVERED BY INSULATING LAYER

(75) Inventors: Ryo Shoda, Tokyo (JP); Eiichi Kitazume, Tokyo (JP); Hajime Yokoi, Tokyo (JP); Koji Murata, Tokyo (JP); Yuko Abe, Tokyo (JP)

(73) Assignee: Toppan Printing Co., Ltd (JP)

( * ) Notice: Subject to any disclaimer, the term of this patent is extended or adjusted under 35 U.S.C. 154(b) by 703 days.

(21) Appl. No.: 11/986,613

(22) Filed: Nov. 21, 2007

(65) Prior Publication Data

US 2008/0124574 A1 May 29, 2008

(30) Foreign Application Priority Data

Nov. 22, 2006 (JP) ................................. 2006-315144
Nov. 30, 2006 (JP) ................................. 2006-323877

(51) Int. Cl.
*H05B 33/10* (2006.01)
*H05B 33/00* (2006.01)

(52) U.S. Cl. ........ 313/504; 313/505; 313/506; 313/512; 428/690; 445/24; 445/25

(58) Field of Classification Search ........... 313/504–506
See application file for complete search history.

(56) References Cited

U.S. PATENT DOCUMENTS

| 7,199,516 B2* | 4/2007 | Seo et al. ....................... 313/504 |
| 2002/0047514 A1* | 4/2002 | Sakurai et al. ................ 313/503 |
| 2004/0079937 A1* | 4/2004 | Miyazawa ....................... 257/10 |
| 2005/0073247 A1* | 4/2005 | Yamazaki et al. ............ 313/503 |
| 2005/0236983 A1* | 10/2005 | Sakai et al. .................... 313/506 |
| 2006/0027830 A1* | 2/2006 | Kumaki et al. ............... 257/103 |

FOREIGN PATENT DOCUMENTS

| JP | 3328297 B2 | 9/2002 |
| JP | 2004-319119 | 11/2004 |

* cited by examiner

*Primary Examiner* — Sikha Roy
(74) *Attorney, Agent, or Firm* — Squire, Sanders & Dempsey (US) LLP

(57) ABSTRACT

According to the present invention a method of manufacturing an organic electroluminescence element and a display device is provided, wherein the method includes forming an organic light emitting medium layer inside a pixel sectioned by a partition wall, wherein an out gas from a partition wall is small, thereby damage to an organic light emitting medium layer is controlled, and wherein, in an organic electroluminescence element, there is no defect and no unevenness because a uniform film is formed without ink-repellent phenomenon on an organic light emitting medium layer.

1 Claim, 3 Drawing Sheets

ORGANIC ELECTROLUMINESCENCE ELEMENT HAVING PARTITION WALL COVERED BY INSULATING LAYER

CROSS REFERENCE

This application claims priority to Japanese application number 2006-315144, filed on Nov. 22, 2006, and priority to Japanese application number 2006-323877, filed on Nov. 30, 2006, the entire contents of which are incorporated herein by reference.

BACKGROUND OF THE INVENTION

1. Field of the Invention

The present invention is related to an organic electroluminescence element and a method of manufacturing the same. More particularly, the present invention is related to a method of manufacturing an organic electroluminescence display device including a wet process, wherein repellent phenomenon or unevenness in each layer of an organic light emitting medium layer does not appear, wherein each pixel emits light uniformly, and wherein the organic electroluminescence display device has a long life time and high efficiency without a dark spot (non-light emitting spot) and leakage of electric current.

2. Description of the Related Art

An organic electroluminescent element has an organic light emitting layer presenting an electroluminescent phenomenon between an anode and a cathode. When a voltage is applied between the electrodes, a hole and electrons are injected into an organic light emitting layer. Then, the hole and electrons recombine in the organic light emitting layer and the organic light emitting layer emits light. In other words, an organic electroluminescent element is a self-luminous element.

From a purpose to improve light emitting efficiency, a hole injection layer, a hole transport layer, an electron transport layer and an electron injection layer are further installed appropriately. A hole injection layer and a hole transport layer are installed between an anode and an organic light emitting layer. An electron transport layer and an electron injection layer are installed between an organic light emitting layer and a cathode. An organic light emitting layer, a hole injection layer, a hole transport layer, an electron transport layer and an electron injection layer can be referred to as an organic light emitting medium layer.

Light emitting efficiency and luminance depend on the film thickness of each layer, therefore the film thickness should be around 100 nm. More particularly, patterning of high accuracy should be formed to make a display panel.

Low molecular materials and polymeric materials are examples of organic light emitting medium materials that can be used to form an organic light emitting medium layer. Generally, as for low molecular materials, a thin film is formed by vacuum evaporation. A mask with minute patterns is used at this time, and patterns are formed. In a manufacturing method which uses vacuum processing such as vacuum evaporation, upsizing of a substrate can diminish the accuracy of the patterning. In addition, due to layering in vacuum, throughput is bad.

Thus the method whereby a polymer material is dissolved in a solvent, and ink is made has been tried recently. This ink is used, and thin film is formed by a wet coating method.

A layer structure in the case where an organic light emitting medium layer is formed by wet coating method using a solution of polymer materials is generally a two-layer structure in which a hole transport layer and an organic light emitting layer are laminated from the anode side.

At this time, in the organic light emitting layer, it is necessary for the organic light emitting inks including organic light emitting materials of red (R) green (G) and blue (B) in a solvent to be applied independently in order to form a color panel.

Examples of methods for forming an organic light emitting medium layer by wet processes include mainly spin coat, die coat, inkjet and print.

Patterning can not be performed only by spin coat or die coat among the above-mentioned methods. Patterning can be performed only by inkjet or print; however ink materials, ink solvent and viscosity are limited, therefore it is difficult to perform stable patterning in inkjet or print. The more high-definition progresses, the more a color ink mixed with another color ink in an adjacent pixel becomes prominent, thereby it becomes more difficult to perform patterning stably and precisely.

In addition, in a case where a color panel is manufactured by the method of not only wet process but also other process, patterning of an electrode is necessary, therefore there is a problem that a leakage current occurs since an electric field concentrates on an end of a patterned electrode.

Accordingly, in a case where patterning is performed, a partition wall pattern as a convex shaped sectioning member is provided in order to solve these problems. A partition wall pattern is formed by a conventional photography process comprising applying a photoresist to a substrate, exposure and development.

Generally a photoresist includes a little of a surface-active agent in order to improve coating performance and film formation performance and in order to prevent unevenness. These surface-active agents are generally hydrophobic. Particularly, the surface-active agents bleed out too much on a substrate in a heating process, thereby an ink repellent phenomenon or a void in a pixel easily occurs when a water type hole transport ink is applied to a substrate.

In addition, in a hardening process, a hydrophilic functional group frequently becomes a bridge formation point, thereby there is a problem that the hydrophilic character of a resin after hardening is lowered.

On the other hand, a hole transport layer is generally applied on the entire area contributing to imaging of an organic electroluminescent display panel without patterning the hole transport layer. A hole transport layer is formed by coating methods such as a spin coat method and a die coat method. Generally a hole transport layer is a thin film with a thickness equal to or less than 100 nm. Therefore, an electric current is easier to spread in a depthwise direction of a hole transport layer than a transverse direction of a hole transport layer. Therefore, it is said that leakage current to the outside of a picture element is small if patterning of an electrode is performed. In the above-mentioned coating method, patterning for every pixel is not necessary, however a hole transport layer is formed on a place where an adhesive for sealing is to be applied and a place where a driver chip is to be equipped, thereby it is necessary to wipe and remove an unnecessary part of a hole transport layer after the hole transport layer is applied. It was very important to form a pattern of not only an organic light emitting layer but also a hole transport layer only on a pixel electrode in order to shorten the manufacturing process and reduce manufacturing costs.

Particularly, in a hole transport material, a water type ink is often used. Therefore, in order to be able to form a flat transport layer, it was necessary to make a partition wall hydrophilic by irradiation with an ultra violet ray, oxygen plasma or the like before forming a hole transport layer as well as to add a solvent or another surface-active agent to a hole transport ink in order to reduce surface tension of the hole transport ink.

Making a partition wall hydrophilic by irradiation with an ultra violet ray is very effective; however there were problems in that a surface of a partition wall which contacted an hole transport ink was not made sufficiently hydrophilic or a surface of a partition wall was not hydrophilic for long time. In addition, there was a problem that, even if the solvent used to reduce a surface tension was soluble in water, an ink composition became unstable, thereby precipitation and unevenness easily occurred since it was difficult to dry the ink uniformly.

In addition, since a surface-active agent generally has low volatile properties, a surface-active agent remains in a hole transport layer after drying, thereby it is pointed out that a surface-active agent badly effects light emitting performance and the life time of an organic EL device. The number of the kinds of usable inks which solve the above-mentioned problem is limited and thereby, a formula for an ink is difficult to produce.

If the surface tension of a partition wall is adjusted to fit to a hole transport material, an organic light emitting layer becomes uneven at a part near the partition wall since the solvent in the organic light emitting layer is different from the solvent in the hole transport material. This phenomenon causes a problem such as a non-lighting spot or a non uniform emitting light. That is, both a flat hole transport layer and a flat organic light emitting layer can not be obtained simultaneously.

Further, even in a case where a layer is formed on the entire surface or a layer is formed in a pattern shape by a dry process when an inorganic material is used for a hole transport layer, in a panel including a partition wall formed by using an organic material, an inorganic material of the hole transport layer is deteriorated by an out gas from the partition wall. This causes a non-lighting spot or a leakage of electric current, and life time becomes shorter and efficiency is reduced.

On the other hand, an organic type solvent is used for an organic light emitting layer, therefore a surface-active agent or a residual solvent included in a partition wall, and a material of a partition wall may liquate out into an organic light emitting layer. This phenomenon may have harmful effects on the light emitting efficiency or life time.

Recently, a technology in order to improve fabrication yield is disclosed whereby a first organic material and a second organic material are layered, thereafter both the formed layers are simultaneously exposed and developed to produce a first insulating layer and a second insulating layer as partition walls. (See patent document 1.)

However, in a panel including a partition wall formed by using an organic material, an light emitting molecule of an organic light emitting layer is deteriorated by an out gas from the partition wall. This causes a non-lighting spot or a leakage of electric current, and life time and efficiency is reduced. In addition, an impurity such as a residual solvent in a partition wall or a material of a partition wall liquate out by a solvent included in the organic light emitting medium layer, thereby light emitting efficiency and life time is reduced.

[patent document 1] Japanese Laid Open Patent No. 2004-319119
[patent document 2] Japanese Patent No. 3328297

SUMMARY OF THE INVENTION

According to the present invention, a method of manufacturing an organic electroluminescence element and a display device, wherein the method includes forming an organic light emitting medium layer inside a pixel sectioned by a partition wall, wherein an out gas from a partition wall is a small, thereby damage to an organic light emitting medium layer is controlled, and wherein, in an organic electroluminescence element, there is no defect and no unevenness because a uniform film is formed without ink-repellent phenomenon on an organic light emitting medium layer, is provided.

In these drawings, 1 is a transparent substrate; 2 is a pixel electrode; 3 is a partition wall; 4 is a insulating layer for covering a partition wall; 5 is a hole transport layer; 6 is a light emitting layer; 7 is a cathode layer; 8 is a glass cap; 9 is a adhesive; 10 is an ink tank; 12 is an ink chamber; 14 is an anilox roll; 14a is an ink layer; 16 is a printing plate; 18 is a printing cylinder; 20 is a flat base; and 24 is a substrate.

DESCRIPTION OF THE PREFERRED EMBODIMENTS

According to study by the inventors of the present invention, when an insulating layer for covering a partition wall, which is one or more layers, is formed on a partition wall wherein the partition wall is formed by applying a photosensitive resin composition to be a partition wall to a substrate and performing exposure through a mask and development, the partition wall is isolated without an opening. Therefore, an out gas from a partition wall is small and damage to an organic light emitting layer is controlled, or a uniform film can be formed without ink-repellent phenomenon on respective organic light emitting medium layers.

Especially, when an insulating layer for covering a partition wall, which is one or more layers, is formed so that θ is equal to tan−1(2b/a), wherein θ is a contact angle between an insulating layer for covering a partition wall and respective organic light emitting medium layers, a is the width of the partition wall and b is the height of the partition wall, damage to the organic light emitting layer is controlled, and a uniform film can be formed without ink-repellent phenomenon on all of the organic light emitting layers.

Figure 1:
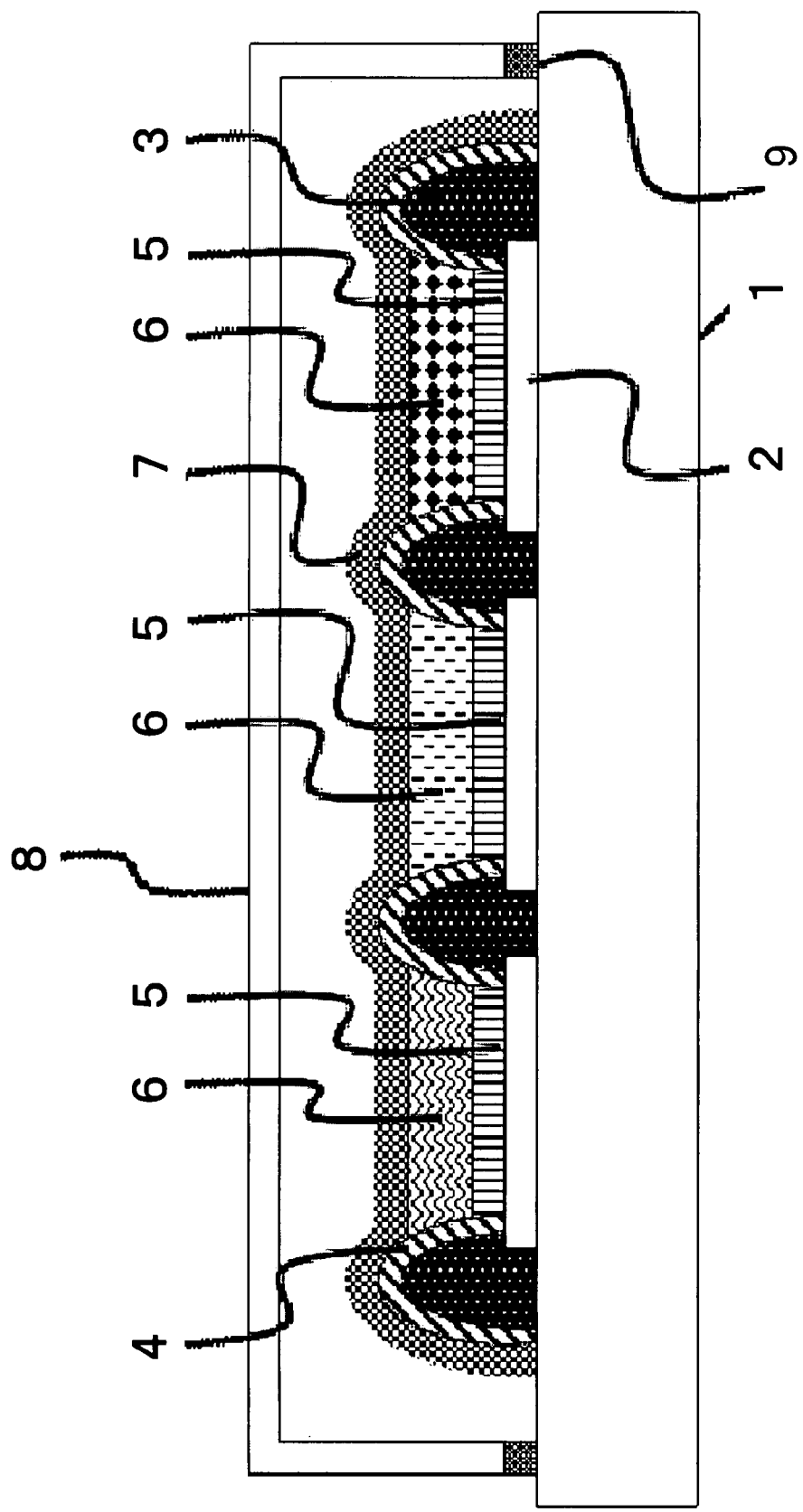
FIG. 1 is a cross section view of one embodiment of an organic electroluminescence device in an organic electroluminescence display panel of the present invention.
Figure 3:
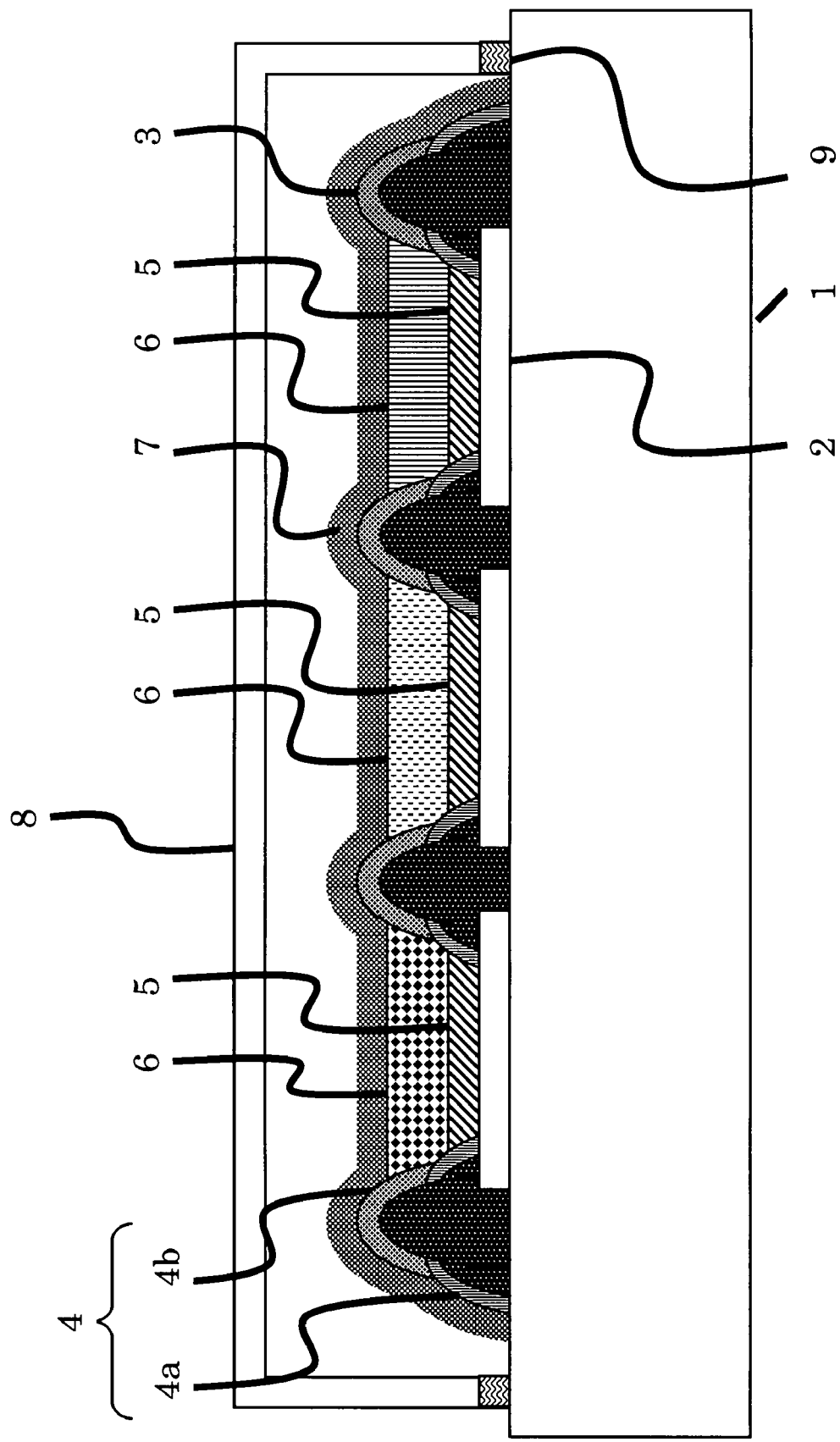
FIG. 3 is a cross section view of another embodiment of an organic electroluminescence device in an organic electroluminescence display panel of the present invention.

As an embodiment of the present invention, an example of manufacturing a passive matrix type organic electroluminescence panel is described below. However, the present invention is not limited to this example. FIG. 1 and FIG. 3 show cross section views of an organic electroluminescence display panel of the present invention.

An organic electroluminescence element in an organic electroluminescence panel is formed on transparent substrate 1. For the transparent substrate 1, a glass substrate and a plastic film or sheet can be used. If a plastic film is used, a polymer type electroluminescent element can be manufactured by take-up. In other words an inexpensive display panel can be manufactured. In addition, for the plastic, polyethylene terephthalate, polypropylene, cyclo-olefin polymers, polyamide, polyethersulfone, polymethyl methacrylate and polycarbonate can be used. In addition, steam or an oxygen barrier layer comprising metallic oxide such as silicon oxide, oxynitrides such as silicon nitrides and polyvinylidene chloride, polyvinyl chloride, saponified ethylene-vinyl acetate copolymer can be formed on these films if necessary.

Pattern-formed, pixel electrodes 2 are formed on a transparent substrate as anodes. For the materials of pixel electrodes 2, transparent electrode materials such as ITO (indium tin complex oxide), IZO (indium zinc complex oxide), tin oxide, zinc oxide, indium oxide and aluminium oxide complex oxide can be used.

In addition, the electrical resistance of ITO is low. ITO has a solvent resistance and is transparent. Therefore, ITO is preferable.

ITO is formed on a transparent substrate by sputter method, ion plating method, vapor deposition method or the like. Patterning of ITO is performed by a photolithography method. ITO becomes line-shaped pixel electrodes 2 in this way.

And, partition wall 3 is formed between adjacent pixel electrodes by the photolithography method using a photosensitive material. In detail, this process comprises a step of applying a photosensitive resin composition on a substrate, a step of forming a partition wall pattern by exposure and development and a step of making a partition wall hydrophilic by light irradiation.

A photosensitive resin can be used as formation material of the partition wall. Both a positive type resist and a negative type resist can be used. Commercial material can be used. Formation material of the partition wall has to have sufficient insulating properties. When the partition wall does not have enough insulating properties, adjacent electrodes short-circuit through the partition wall. Therefore, display defects occur. By way of example only, material such as polyimide system, an acryl resin system, a novolak resin system or a fluorene system can be used. However, the usable material is not limited to these materials. In addition, light shielding materials may be included in the above described materials for the partition wall formation for the purpose of improving display quality of an organic electroluminescent element.

A light-sensitive resin for forming partition wall 3 is applied by well-known application machines such as a spin coater, a bar coating machine, a roll coater, a die coating machine and an engraved-roll coater.

In a next step of forming a partition wall pattern by exposure through a mask and development, by a conventional well-known exposure/development method, a pattern of a partition wall part can be formed. (FIG. 1, FIG. 3.) It is desirable that a partition wall having two steps be used in a case of a two layer type organic light emitting medium layer including a hole transport layer and an organic light emitting layer. However, the type of the partition wall is not limited to this type. (FIG. 3)

It is desirable than the height of the partition wall 3 in the present invention be 0.1 μm-30.0 μm. In addition, the width of a bottom face of the partition wall in the present invention is 10 μm-40 μm.

By providing the partition wall 3 between adjacent pixel electrodes 3, a hole transport ink printed on each of the pixel electrodes can be prevented from flowing and the short circuit at an end of a transparent conductive layer can be prevented from occurring. Since the short circuit is not always prevented if a partition wall is too low, the height of a partition wall is important.

In addition, for example, in a case of a passive matrix type organic electroluminescence display panel, when partition wall 3 is formed between pixel electrodes, partition wall 3 is formed so as to be perpendicular to a cathode layer. In a case where a cathode layer is formed across the partition wall, if the partition wall is too high, a cathode layer may be cut and display defects may occur.

In such a case, it is desirable that the height of partition wall 3 be, more preferably, equal to or less than 5.0 μm. In a case of partition wall 3 having a height of 5.0 μm or less, a cathode is not easily cut.

In addition, in a case of a partition wall having two steps, it is necessary for the height of the first step to be equal to or more than a film thickness of a hole transport layer and equal to or less than the total film thickness of both a hole transport layer and an organic light emitting layer, and for the height of the second step to be equal to or more than the film thickness of an organic light emitting layer.

After partition wall 3 has been formed, an insulating layer for covering a partition wall 4 is formed. In addition, in a case of a partition wall having two steps, the insulating layer for covering a partition wall 4 consisting of an insulating layer for covering a partition wall corresponding to a hole transport layer 4a and an insulating layer for covering a partition wall corresponding to an organic light emitting layer 4b can be formed. (FIG. 3) Inorganic insulating bodies such as oxide, nitride and fluoride such as $SiO_2$, $Sc_2O_3$, $TiO_2$, $V_2O_5$, $Y_2O_3$, $ZrO_2$, $Nb_2O_5$, SiN, $Si_2N_3$, $SiN_4$, SiF and $MoO_2$ can be preferably used for a material of an insulating layer for covering a partition wall. By using these materials, a pattern is formed by a vacuum evaporation method using a mask, or a pattern is formed by forming a film on the entire surface by plasma a CVD method or sputter method and etching the film through a photolithography process. If the contact angle θ between an insulating layer for covering a partition wall and a respective organic light emitting medium material in a wet state where the material is layered by a wet process, is equal to $\tan^{-1}(2b/a) \pm 5°$, wherein a is the width of a bottom face of a partition wall and b is the height of a partition wall, the flatness of an ink layer on a pixel electrode is preferably improved.

Further, in a case where an insulating layer for covering a partition wall 4, an insulating layer for covering a partition wall corresponding to a hole transport layer 4a or an insulating layer for covering a partition wall corresponding to an organic light emitting layer 4b, is made from almost the same materials, depositing can be performed by sputtering using the same target, thereby depositing can be simply performed for a short time.

It is desirable that the film thickness of an insulating layer for covering a partition wall be equal to or more than 5 nm. In a case of such a film thickness, good insulating properties without a pin hole are expected. More preferable, it is equal to or more than 10 nm.

A surface property of the formed insulating layer for covering a partition wall can be changed by UV ozone cleaning according to the purpose.

After an insulating layer for covering a partition wall 4 has been formed, hole transport layer 5 is formed. In the present invention, it is desirable that a water type hole transport ink having a pH of 3 or less be used as a hole transport ink to form hole transport layer 5. In a solution type, there is a problem that precipitation easily occurs during printing of a hole transport ink.

In addition, the above-mentioned dispersion type hole transport ink is often acid. In this invention, it is desirable that the acid ink should be used without making the ink neutral. This is because it is possible that the stability of the ink becomes worse or the hole transport properties become poor by making the ink neutral. In addition, making the ink neutral by an inorganic alkali or the like should be avoided because an ion component is mixed and the life time is reduced.

As the above-mentioned hole transport ink, poly (3,4-ethylenedioxy thiophene) (PEDOT):(PSS) is especially preferable in the light of conductivity and hole transport properties. This material is dissolved or dispersed in a solvent to be a hole transport ink which is printed by relief printing. In addition, it is desirable that volume resistivity of the formed hole transport layer should be $1 \times 10^6$ Ω·cm or less in the light of light emitting efficiency.

In addition, for solvents dissolving a hole transport material, mixed solvents comprising solvents such as toluene, xylene, acetone, methyl ethyl ketone, methyl isobutyl ketone, cyclohexanone, methanol, ethanol, isopropanol, ethylene glycol, propylene glycol, polyethylene glycol, glycerine, ethyl acetate, butyl acetate, isopropyl acetate and water can be used. It is desirable that water or a solvent, wherein any amount of the solvent can be mixed with water, be used.

Figure 2:
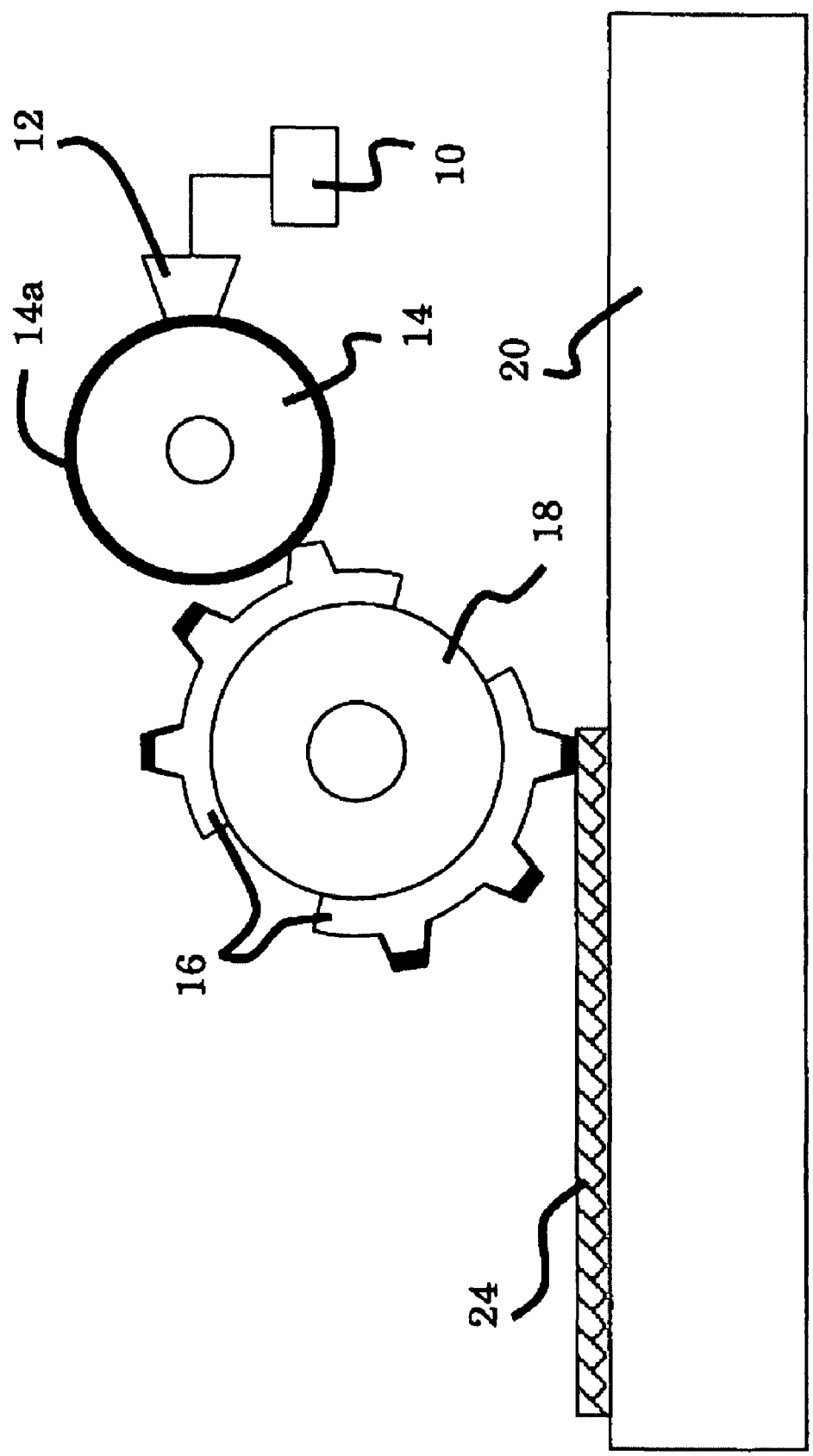
FIG. 2 is a schematic cross section view of relief printing apparatus used in the present invention.

FIG. 2 is a schematic illustration of a relief printing apparatus printing hole transport ink comprising a hole transport material on the substrate including a pixel electrode and a partition wall. This printer has an ink tank 10, an ink chamber 12, an anilox roll 14 and a plate cylinder 18 on which relief printing plate 16 is put. A hole transport ink diluted with a solvent is taken to ink tank 10. A hole transport ink is sent into ink chamber 12 from ink tank 10. Anilox roll 14 contacts with the ink feed section of ink chamber 12, and it is supported rotatably.

According to the rotation of an anilox roll 14, ink layer 14a comprising a hole transport ink supplied on an anilox roll face becomes uniform. This ink layer transfers on relief parts (projection parts) of a plate 16 mounted on a printing cylinder 18 which is rotationally driven in proximity to an anilox roll. A substrate 24 on which transparent electrodes and a partition wall are formed is transported to a printing position of a flat base 20 by a transporting means that are not illustrated. And ink on relief parts of a plate 16 is printed on a substrate 24. And ink is dried if necessary. A hole transport layer is formed on a substrate in this way.

In addition, an embodiment of a relief printing plate is a water-developable light-sensitive resin relief printing plate. For photosensitive resin plates, there are a solvent developing type and a water developing type. In the case of a solvent developing type photosensitive resin plate, an organic solvent is used as a liquid developer of an exposed resin plate. In the case of a water-developable photosensitive resin plate, water is used as a liquid developer for an exposed resin plate. A solvent developing type photosensitive resin plate shows resistance to water type ink. A water-developable photosensitive resin plate shows resistance to organic solvent system ink. In the present invention, all photosensitive resin plates having resistance to hole transport ink can be used.

According to the above-mentioned method, hole transport layer 5 is formed by printing a hole transport ink, by the above-mentioned relief printing method, on substrate 1 provided with partition wall 3, thereafter drying and burning are performed. At this time, partition wall 3 is burned simultaneously. The condition of the burning process where partition wall 3 and hole transport layer 5 are burned simultaneously is heating at 200° C.-250° C. for 10 minutes-60 minutes. During this burning process, both the hole transport layer and the partition wall are cured completely, thereby an organic electroluminescence device having sufficient resistant properties can be obtained. In a case where the burning temperature is equal to or lower than 200° C., such temperature is too low for burning both a hole transport layer and a partition wall, thereby there may be such problems as non-hardening of a partition wall material and insufficient evaporation of water from a hole transport layer. On the other hand, in a case where the temperature is equal to 250° C. or higher, since such temperature is too high, there may be such problems as heat deterioration of a partition wall and a hole transport layer. In addition, in a case where the burning time is 10 minutes or shorter, the burning is insufficient. In a case where the burning time is 60 minutes or longer, productivity is bad.

In the above description, an example of a method of forming a hole transport layer by a wet process using a hole transport ink is shown. However, a hole transport layer can be formed by a dry process using an inorganic material.

Examples of inorganic materials include alkali metals such as Li, Na, K, Rb, Ce and Fr, alkaline-earth metals such as Mg, Ca, Sr and Ba, lanthanoids such as La, Ce, Sm, Eu, Gd and Yb, metallic elements such as Au, Cu, Al, Fe, Ni, Ru, Sn, Pb, Cr, Ir, Nb, Pt, W, Mo, Ta, Pa and Co, Si, Ge, and oxide, carbide, nitride, and boride thereof. Examples are MoOx, NiOx and TiOx.

A hole transport layer of an inorganic material can be formed a dry process such as resistance heating method, sputtering method, evaporation method or the like.

Since an insulating layer for covering a partition wall, which is one or more layers, covers a partition wall pattern, deterioration of an inorganic material of a hole transport layer can be prevented. This deterioration causes non-lighting spot or leakage of electric current. Therefore, efficiency and life time are not reduced.

After forming hole transport layer 5, an organic light emitting layer is formed. An organic light emitting layer is a layer emitting light by an electric current. Examples of organic light emitting materials forming organic light emitting layers include the materials which are light emitting pigments such as coumarin system, perylene system, a pyran system, anthrone system, porphyrin system, quinacridon system, N,N'-dialkyl permutation quinacridon system, naphthalimido system, N,N'-diaryl permutation pyrrolo pyrrole series and iridium complex system. These materials can be scattered in macromolecules such as polystyrene, polymethyl methacrylate and polyvinyl carbazole. In addition, high polymer materials such as poly arylene system, PAV [polyarylenevinylene] system, a poly fluorene system or a polyphenylene vinylene system can be used.

An organic light emitting ink is prepared by dissolving these organic light emitting materials in a solvent. For a solvent dissolving an organic light emitting material, toluene, xylene, acetone, anisole, methyl ethyl ketone, methyl isobutyl ketone and cyclohexanone can be used. The above-mentioned solvent may be used alone. In addition, the above mentioned solvent may be used as a mixed solvent.

Above all, aromatic organic solvent such as toluene, xylene and anisole is preferred from the aspect of solubility of an organic light emitting material.

In addition, a surface active agent, an antioxidant, a viscosity modifier and an ultraviolet absorber may be added to an organic light emitting ink if necessary.

In addition, for a formation method of an organic light emitting layer pattern, relief printing can be used. In addition, ink jet process, intaglio offset printing and relief reversal offset printing can also be used. In addition, when an organic light emitting layer is formed by relief printing, a plastic plate suitable to an organic light emitting ink can be used. Above all, a water-developable light-sensitive resin relief printing plate is preferred.

After having formed organic light emitting layer 5, a line pattern cathode layer 6 which is perpendicular to line pattern pixel electrodes is formed. For a material of a cathode layer 6, the material which is suitable for light emitting properties of an organic light emitting layer can be used. For example, metal simple substance such as lithium, magnesium, calcium, ytterbium and aluminium can be used. An alloy of the above mentioned metal simple substance and the stable metal such as gold and silver can be used. In addition, conductive oxidate of indium, zinc, tin or the like can be used. For a formation method of a cathode layer, a vacuum evaporation method using a mask (a sputter method, an ion plating method) can be used.

In addition, in the case of an organic electroluminescence element of the above mentioned embodiment, there is a hole transport layer and an organic light emitting layer between the pixel electrode which is an anode and a cathode layer. In addition, there may be a hole blocking layer, an electron transport layer and an electron injection layer between an anode and a cathode layer if necessary.

In addition, a method of forming a light emitting layer can be used when these layers are formed.

Finally an organic electroluminescent element is sealed using a glass cap 7 and an adhesive 8 to protect the organic electroluminescent element from outside oxygen and moisture. An organic electroluminescent display panel can be obtained in this way.

In addition, in the case of an organic electroluminescent element having a flexible transparent substrate, the organic electroluminescent element may be sealed using a sealing compound and a flexible film.

Damage to an organic light emitting medium layer is controlled, and a uniform film is formed, that is, an ink for an organic light emitting medium layer does not wet an upper portion of a partition wall and is not repelled. Therefore an organic electroluminescence element without defect and unevenness can be obtained.

In addition, the contact angle is adjusted, thereby an ink for an organic light emitting medium layer does not wet an upper portion of a partition wall and is not repelled at a part where an ink contacts with a partition wall or contacts with all of a partition wall. Therefore an organic electroluminescence display device can be obtained.

EXAMPLE

Example 1

An example is described. A thin film of ITO (an indium tin oxide) was formed by sputter method to a diagonal glass substrate of 1.8 inches size. By means of photolithography method and etching by acid solution, patterning of thin film of ITO was performed, and a pixel anode was formed. The shape of the pixel electrode is described. The line width was 136 μm. The space was 30 μm and 192 lines of pixel electrodes were formed in about 32 mm width.

Next, a partition wall was formed by the following method:

Positive photosensitive polyimide was applied to the entire surface of a glass substrate provided with a pixel electrode by spin coating. The height of a partition wall was 1.5 μm. A photosensitive material formed on the entire surface of a substrate was exposed and developed by photolithography method to form a line-pattern partition wall between pixel electrodes. After this process, a partition wall was burned at 230° C. for 30 minutes in air.

Next, an insulating layer for covering a partition wall was formed by the following process: SiON was layered on the entire surface by plasma CVD method so that a film thickness thereof is 5 nm; and thereafter a pattern was formed by photolithography and etching.

A hole transport ink comprising the following materials was made:

hole transport material: 80 percent weight.
ultrapure water: 20 percent weight.

The viscosity of this PEDOT solution was 5.5 mPa·s.

A hole transport layer was formed between partition walls by relief printing using the above mentioned ink.

After printing, both the partition wall and the hole transport layer were simultaneously burned in atmospheric air at 230 degrees Celsius for 30 minutes to form a partition wall and a hole transport layer. The hole transport layer thickness was 50 nm.

The patterning condition of the formed hole transport layer was checked.

A polyphenylene vinylene derivative (organic light emitting material) was dissolved in toluene. The density of a polyphenylene vinylene derivative was 1%. This was organic light emitting ink. This organic light emitting ink was used, and an organic light emitting layer was formed by relief printing method on pixel electrodes between partition walls. The film thickness of organic light emitting layer after printing and drying was 80 nm.

The patterning condition of the formed organic light emitting layer was checked.

Thereupon, a cathode layer comprising Al and Ba was formed. A mask evaporation method by resistance heating evaporation method was applied to the formation of a cathode layer. A pattern of a cathode layer was formed in a line. A line-shaped cathode layer is perpendicular to the line pattern of anode electrodes. A glass cap and adhesive were used, and this organic electroluminescent assembly was sealed last to protect this organic electroluminescent assembly from external oxygen and moisture. In this way the organic electroluminescent display panel was obtained.

An anode side fetch electrode and a cathode side fetch electrode are connected to each pixel electrode in the area around the display part of the organic electroluminescent display panel obtained in this embodiment. By connecting a power supply to these electrodes, the display of the organic electroluminescent device was confirmed, and an emitted light state and emitted light characteristics were checked.

As a result, a film thickness was such that the difference in luminance between a place near a partition wall of the light emitting surface and a center place between partition walls was 5% or less. In addition, luminance was 160 cd/m$^2$ at 6V. A half-value period in luminance where an initial luminance was 400 cd/m$^2$ was 1600 hrs. That is, the display characteristics of high light emitting efficiency, high light emitting luminance and long life time could be achieved. Further, when an accelerated test at a condition of constant-temperature and high-humidity (temperature 50° C., humidity 90%) was performed, a dark spot was not observed in a light emitting surface before 5000 hrs passed.

Example 2

An organic electroluminescence display panel was manufactured by the same method as Example 1 except for an insulating layer covering a partition wall, whose film thickness was 20 nm.

As a result, the film thickness was such that the difference in luminance between a place near a partition wall of the light emitting surface and a center place between partition walls was 5% or less. In addition, luminance was 160 cd/m$^2$ at 6V. A half-value period in luminance where an initial luminance was 400 cd/m$^2$ was 2000 hrs. That is, good display characteristics of high light emitting efficiency, high light emitting luminance and long life time, having a uniform light emitting surface, could be achieved. Further, when an accelerated test at a condition of constant-temperature and high-humidity (temperature 50° C., humidity 90%) was performed, a dark spot was not observed in a light emitting surface before 8000 hrs passed.

Comparative Example 1

An organic electroluminescence display panel was manufactured by the same method as Example 1 except for the panel having no insulating layer covering a partition wall.

As a result, the difference in luminance between a place near a partition wall of light emitting surface and a center place between partition walls was 20%, that is, uneven luminance. The luminance was 100 cd/m$^2$ at 6 V. A half-value period in luminance where an initial luminance was 400 cd/m$^2$ was 1200 hrs. Further, when an accelerated test at a condition of constant-temperature and high-humidity (temperature 50° C., humidity 90%) was performed, a dark spot was observed in a light emitting surface when 1000 hrs passed.

Example 3

As a hole transport material to form a hole transport layer 5, molybdenum oxide was used, and a hole transport layer was formed on the entire surface by vacuum evaporation method. The film thickness of a hole transport layer was 100 nm. A sample in example 3 was manufactured by the same method as example 1 except for a hole transport layer.

As a result, the difference in luminance between a place near a partition wall of light emitting surface and a center place between partition walls was 3% or less. The luminance was 200 cd/m$^2$ at 6 V. A half-value period in luminance where an initial luminance was 400 cd/m$^2$ was 2000 hrs. That is, the display characteristics of high light emitting efficiency, high light emitting luminance and long life time could be achieved. Further, when an accelerated test at a condition of constant-temperature and high-humidity (temperature 50° C., humidity 90%) was performed, a dark spot was not observed in a light emitting surface before 5000 hrs passed.

Example 4

A sample was manufactured by the same method as Example 3 except for an insulating layer for covering a partition wall having a film thickness of 20 nm.

As a result, a film thickness was such that the difference in luminance between a place near a partition wall of light emitting surface and a center place between partition walls was 3% or less. In addition, the luminance was 200 cd/m$^2$ at 6V. A half-value period in luminance where an initial luminance was 400 cd/m$^2$ was 2500 hrs. That is, good display characteristics of high light emitting efficiency, high light emitting luminance and long life time, having a uniform light emitting surface, could be achieved. Further, when an accelerated test at a condition of constant-temperature and high-humidity (temperature 50° C., humidity 90%) was performed, a dark spot was not observed in a light emitting surface before 8000 hrs passed.

Comparative Example 2

A sample was manufactured by the same method as Example 3 except for having no insulating layer for covering a partition wall.

As a result, the difference in luminance between a place near a partition wall of light emitting surface and a center place between partition walls was 3%. The luminance was 150 cd/m$^2$ at 6 V. When an accelerated test at a condition of constant-temperature and high-humidity (temperature 50° C., humidity 90%) was performed, a dark spot was observed in a light emitting surface when 1000 hrs passed. In addition, a half-value period in luminance where an initial luminance was 400 cd/m$^2$ was not measured since a dark spot occurred.

Example 5

An ITO thin film was formed by sputter method on a glass substrate of which the diagonal was 1.8 inches. Patterning of ITO thin film was performed by photolithography method and etching using an acid solution. The pixel electrodes were formed in this way.

Line patterns of pixel electrodes are described below. The line width was 136 μm, space width was 30 μm. There were 192 lines in 32 mm square.

Next, a partition wall was formed by the following method: Positive photosensitive polyimide was applied to an entire surface of a glass substrate provided with a pixel electrode by spin coating. The photosensitive material applied to the entire surface was exposed by using a multiple tone photomask. After the exposed part had been developed, a partition wall having steps was formed by post bake. In the shape of a partition wall, the height was 30 μm, the width of a bottom face was 40 μm, the height of a hem was 0.05 μm and the width of the hem was 10 μm. Thereafter, a partition wall was burned at 230° C. for 30 minutes in air.

Next, an insulating layer for covering a partition wall was formed as follows: TiO$_2$ was layered on the entire surface by vacuum evaporation method so that film thickness thereof is 20 nm; Thereafter, an insulating layer for covering a partition wall corresponding to a hole transport layer was obtained by photolithography and etching; next, an insulating layer for covering a partition wall corresponding to an organic light emitting medium layer was obtained by forming a pattern of 20 nm film thickness by vacuum evaporation method using a mask and ZrO$_2$.

A hole transport ink comprising the following materials was made:
hole transport material: 80 percent weight.
ultrapure water: 20 percent weight.

The viscosity of this PEDOT solution was 5.5 mPa·s.

A hole transport layer was formed between partition walls by relief printing using the above mentioned ink.

After printing, both a partition wall and a hole transport layer were simultaneously burned in atmospheric air at 230 degrees Celsius for 30 minutes to form a partition wall and a hole transport layer. The hole transport layer thickness was 50 nm.

The patterning condition of the formed hole transport layer was checked. As a result, it was confirmed that the shape of the film was flat.

A polyphenylene vinylene derivative (organic light emitting material) was dissolved in toluene. The density of a polyphenylene vinylene derivative was 1%. This was organic light emitting ink. This organic light emitting ink was used, and an organic light emitting layer was formed by relief printing method on pixel electrodes between partition walls. The film thickness of the organic light emitting layer after printing and drying was 80 nm.

The patterning condition of the formed organic light emitting layer was checked. As a result, it was confirmed that the shape of the film was flat.

Thereupon, a cathode layer comprising Al and Ba was formed. The mask evaporation method by resistance heating evaporation method was applied to the formation of a cathode layer. A pattern of a cathode layer was formed in a line. A line-shaped cathode layer is perpendicular to the line pattern of anode electrodes. A glass cap and an adhesive were used, and this organic electroluminescent assembly was sealed last to protect this organic electroluminescent assembly from external oxygen and moisture. In this way the organic electroluminescent display panel was obtained.

An anode side fetch electrode and a cathode side fetch electrode are connected to each pixel electrode in the area around the display part of the organic electroluminescent display panel obtained in this embodiment. By connecting a power supply to the fetch electrodes, the display of the organic electroluminescent device was confirmed, and an emitted light state and emitted light characteristics were checked.

As a result, a film thickness was such that the difference in luminance between a place near a partition wall of light emitting surface and a center place between partition walls was 3% or less. In addition, the luminance was 160 cd/m$^2$ at 6 V. A half-value period in luminance where an initial luminance was 400 cd/m$^2$ was 2000 hrs. That is, good display characteristics of high light emitting efficiency, high light emitting luminance and long life time, having a uniform light emitting surface, could be achieved. Further, when an accelerated test at a condition of constant-temperature and high-humidity (temperature 50° C., humidity 90%) was performed, a dark spot was not observed in a light emitting surface before 8000 hrs passed.

Reference Example 1

In Example 5, an insulating layer for covering a partition wall was obtained by forming a pattern, by layering TiO$_2$ of 20 nm film thickness on the entire surface by vacuum evaporation method, and by photolithography and etching. A sample was manufactured by the same method as Example 5 except for an insulating layer for covering a partition wall.

When the shape of a pattern of the formed hole transport layer was checked, the shape of the layer was flat.

Next, when the shape of a pattern of the formed organic light emitting layer was checked, the shape of the layer was formed to the upper portion of the partition wall along the partition wall.

As a result, the difference in luminance between a place near a partition wall of light emitting surface and a center place between partition walls was 5% or less. The luminance was 160 cd/m$^2$ at 6 V. A half-value period in luminance where an initial luminance was 400 cd/m$^2$ was 1600 hrs. That is, display characteristics of high light emitting efficiency, high light emitting luminance and long life time could be achieved. Further, when an accelerated test at a condition of constant-temperature and high-humidity (temperature 50° C., humidity 90%) was performed, a dark spot was not observed in a light emitting surface before 5000 hrs passed.

Comparative Example 3

An organic electroluminescence display panel was manufactured by the same method as Example 5 except for the panel having no insulating layer covering a partition wall.

When the shape of a pattern of the formed hole transport layer was checked, the shape of the layer was formed to the upper portion of the partition wall along the partition wall. When the shape of a pattern of the formed organic light emitting layer was checked, the shape of the layer was formed to the upper portion of the partition wall along the partition wall. As a result, the difference in luminance between a place near a partition wall of light emitting surface and a center place between partition walls was 20%, that is, uneven luminance. The luminance was 100 cd/m$^2$ at 6 V. A half-value period in luminance where an initial luminance was 400 cd/m$^2$ was 1200 hrs. Further, when an accelerated test at a condition of constant-temperature and high-humidity (temperature 50° C., humidity 90%) was performed, a dark spot was observed in a light emitting surface when 1000 hrs passed.

What is claimed is:

1. An organic electroluminescence element, comprising,
a substrate;
a pixel electrode formed on said substrate;
a partition wall sectioning said pixel electrode;
one or more insulating layers for covering said partition wall;
an organic light emitting medium layer arranged on said pixel electrode;
wherein said organic light emitting medium layer includes a hole transport layer and an organic light emitting layer, said organic light emitting layer formed on said hole transport layer; said hole transport layer comprising an oxide of molybdenum;
and
a cathode arranged on said organic light emitting medium layer so as to face said pixel electrode
wherein said insulating layers for covering said partition wall includes a first insulating layer for covering said partition wall corresponding to said hole transport layer, and wherein
said insulating layers for covering said partition wall includes a second insulating layer for covering said partition wall corresponding to said organic light emitting layer,
and
wherein a cross section of said partition wall has a shape of a plurality of steps.

* * * * *